(12) United States Patent
Furneaux

(10) Patent No.: US 6,556,090 B1
(45) Date of Patent: Apr. 29, 2003

(54) OSCILLATOR CIRCUIT FOR A VALIDATOR

(75) Inventor: David Michael Furneaux, Reading (GB)

(73) Assignee: Mars Incorporated, McLean, VA (US)

( * ) Notice: Subject to any disclaimer, the term of this patent is extended or adjusted under 35 U.S.C. 154(b) by 0 days.

(21) Appl. No.: 09/762,857

(22) PCT Filed: Jul. 21, 1999

(86) PCT No.: PCT/GB99/02365

§ 371 (c)(1),
(2), (4) Date: Apr. 2, 2001

(87) PCT Pub. No.: WO00/10246

PCT Pub. Date: Feb. 24, 2000

(30) Foreign Application Priority Data

Aug. 14, 1998 (GB) .............................................. 9817827

(51) Int. Cl.[7] ......................... G01N 27/00; G01N 27/72; H03B 5/08; H03B 5/12
(52) U.S. Cl. ..................... 331/65; 331/117 R; 324/236
(58) Field of Search ............... 331/60, 61, 65, 331/117 R, 117 FE, 117 D, 175; 324/236, 237; 340/941

(56) References Cited

U.S. PATENT DOCUMENTS

| | | | |
|---|---|---|---|
| 3,229,198 A | 1/1966 | Libby | |
| 3,271,664 A | 9/1966 | Mountz et al. | |
| 3,373,856 A | 3/1968 | Kusters et al. | |
| 3,939,429 A * | 2/1976 | Löhn et al. .................. | 325/432 |
| 4,128,158 A | 12/1978 | Dautremont, Jr. | |
| 4,462,513 A | 7/1984 | Dean et al. | |
| 4,527,130 A * | 7/1985 | Lütteke ...................... | 331/36 |
| 4,678,994 A | 7/1987 | Davies | |
| 4,859,969 A | 8/1989 | Malinowski et al. | |
| 4,898,564 A | 2/1990 | Gunn et al. | |
| 4,995,497 A | 2/1991 | Kai et al. | |
| 5,038,105 A * | 8/1991 | Codringten et al. ........ | 324/318 |
| 5,057,778 A * | 10/1991 | Rath .......................... | 324/322 |
| 5,166,621 A * | 11/1992 | Codrington et al. ........ | 324/322 |
| 5,231,361 A * | 7/1993 | Smith et al. ................. | 331/56 |
| 5,263,197 A | 11/1993 | Manjo et al. | |
| 5,486,796 A * | 1/1996 | Ishikawa et al. ......... | 331/117 R |
| 5,751,140 A | 5/1998 | Canter | |
| 6,075,817 A * | 6/2000 | Gruenberg .................. | 375/240 |
| 6,081,120 A * | 6/2000 | Shen .......................... | 324/318 |
| 6,150,816 A * | 11/2000 | Srinivasan .................. | 324/318 |
| 6,249,190 B1 * | 6/2001 | Rozenblit et al. ............. | 331/46 |
| 6,316,754 B1 * | 11/2001 | Schatz et al. ................ | 219/656 |

FOREIGN PATENT DOCUMENTS

| | | |
|---|---|---|
| DE | 25 49 328 A | 5/1977 |
| GB | 1 397 083 A | 6/1975 |
| GB | 2 069 211 A | 8/1981 |
| GB | 2 302 625 A | 1/1997 |

\* cited by examiner

*Primary Examiner*—David C. Mis
(74) *Attorney, Agent, or Firm*—Fish & Richardson P.C.

(57) ABSTRACT

A coin validator tests a coin using a pair of coils coupled in an oscillator circuit which is arranged to drive both the coils concurrently at two separate frequencies without interference therebetween, each frequency signal being influenced by the presence of a coin. Preferably, the coils are connected in series in a feedback loop to form a first oscillator, and the second oscillator is coupled to the interconnection between the coils the other ends of which are effectively short circuited at the frequency of the second oscillator.

16 Claims, 3 Drawing Sheets

OSCILLATOR CIRCUIT FOR A VALIDATOR

BACKGROUND OF THE INVENTION

This invention relates to oscillations, and particularly but not exclusively to oscillators for use in currency validators, especially coin validators.

It is known to test coins using inductances in the form of coils positioned in proximity to a coin path, and driven by oscillators. As the coin passes the coil, the performance of the oscillator circuit is monitored to determine the effect of the coin and thus provide a measurement of the coin's properties. The influence of the coin on the frequency, amplitude or phase of the oscillations may be monitored. The measurement is normally based on the change in a monitored parameter, for example the difference or ratio between the parameter when the coin is absent and that when the coin is present.

The influence of the coin on the measured parameter is a function of frequency. See, for example, GB-A-1 397 083. It is known to subject the coin to oscillations at two separate frequencies and measure the effect at both frequencies in order to derive further information about the coin. This is particularly useful for clad coins (formed e.g., by an outer material rolled on top of an inner material, or by plating the inner material), as higher frequencies will be less influenced by the inner material and more influenced by the outer material. The inner material of a clad coin is sometimes referred to as the "bulk" or "core" material.

GB-A-2 069 211 discloses a coin validator in which a coil on one side of a coin path is driven at a combination of two frequencies, and a receiving coil at the opposite side of the coin path is coupled to means for detecting the influence of a coin on the amplitude of the received signal at the two different frequencies. Monitoring means are connected to the receiving coil through filter circuits to separate the different frequencies. However, this arrangement does not permit a variation in the oscillation frequency as a result of the presence of the coin. Furthermore, the use of a transmit/receive arrangement is often undesirable, particularly as the received signal strength varies by very large amounts, especially with magnetic coins. It would also be desirable to avoid the use of filters.

SUMMARY OF THE INVENTION

Aspects of the present invention are set out in the accompanying claims.

According to a further aspect, two self-excited oscillators operate at different frequencies and share at least one common inductance. Such an arrangement can be used in a coin validator for testing a coin, in which the value of the inductance is influenced by a coin under test.

It is known to use a pair of coils, for determining the material content of a coin. By using an oscillator coupled to both coils, this arrangement produces significantly more gain than a single coil, due to the mutual inductance between the coils. However, because both coils are running at the same frequency, only a single material measurement is made.

According to a preferred aspect of the invention, the two self-excited oscillators share a pair of coils, positioned one on each side of a coin path. Operating both coils concurrently at different frequencies is particularly useful for determining the material content of the coin at different depths within the coin.

Crosstalk between the oscillators could be avoided by appropriate filter circuits. However, in a particularly preferred embodiment, the oscillators are configured so that oscillations at each frequency appear at a node which constitutes a signal null for the other frequency. This isolates the frequencies without requiring additional filter circuits.

In the preferred embodiment, a signal null for one frequency is produced because, at that frequency, there is a very low a.c. impedance to a.c. ground. A signal null for another frequency is produced because the other frequency is applied to the node in equal and opposite amounts.

BRIEF DESCRIPTION OF THE DRAWINGS

Arrangements embodying the invention will now be described by way of example with reference to the accompanying drawings, in which.

DETAILED DESCRIPTION

Figure 1:
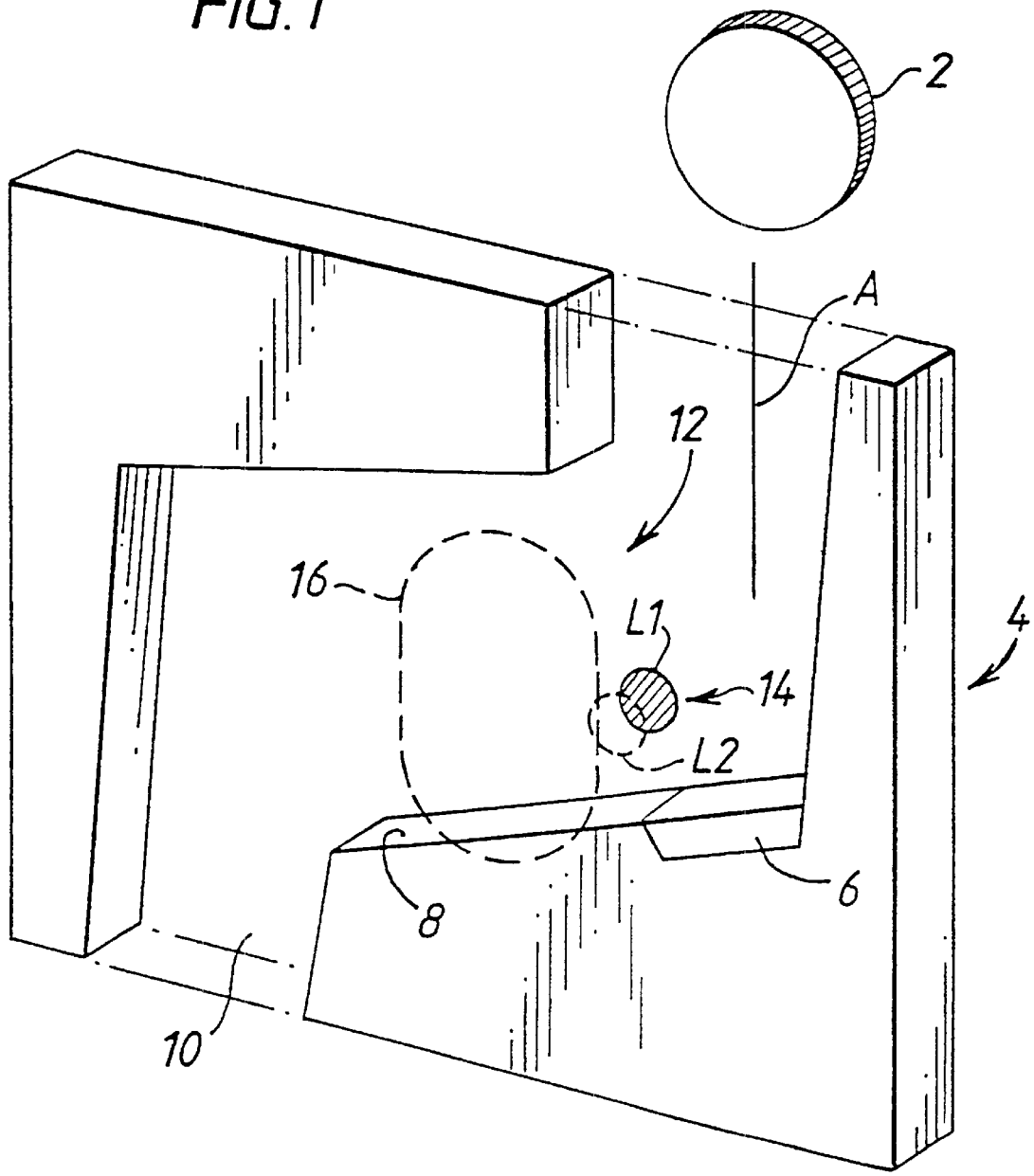
FIG. 1 illustrates the positioning of coils of a coin validator in accordance with the invention.

Referring to FIG. 1, coins, such as the coin illustrated at 2, enter the validator 4 via a chute (not shown) and then fall in the direction of arrow A on to an energy-absorbing element 6. Then they roll down a ramp 8 and enter an exit path 10.

As they roll down the ramp 8, the coins pass a test region 12. In this test region there are a number of inductive sensors, such as those indicated at 14 and 16. The sensor 14 comprises two coils, schematically illustrated at L1 and L2. The coil L1 is mounted on the flight deck itself, and the coil L2 is mounted on the lid (not shown) of the validator. The coils L1 and L2 are of similar configuration and size, and are mounted directly opposite each other. They are positioned at the appropriate distance above the surface of the ramp 8 preferably such that they are capable of being fully occluded by any coin which the validator is designed to validate.

The coils L1 and L2 are located behind a membrane separating the front surfaces of the coils from the surfaces of the flight deck and lid, respectively, but for the purposes of clarity these membranes are not shown in the figure. The flight deck is oriented such that coins pass the coil L2 in close proximity thereto, but are spaced from the opposed coil L1 by distances which depend on coin thickness.

Figure 2:
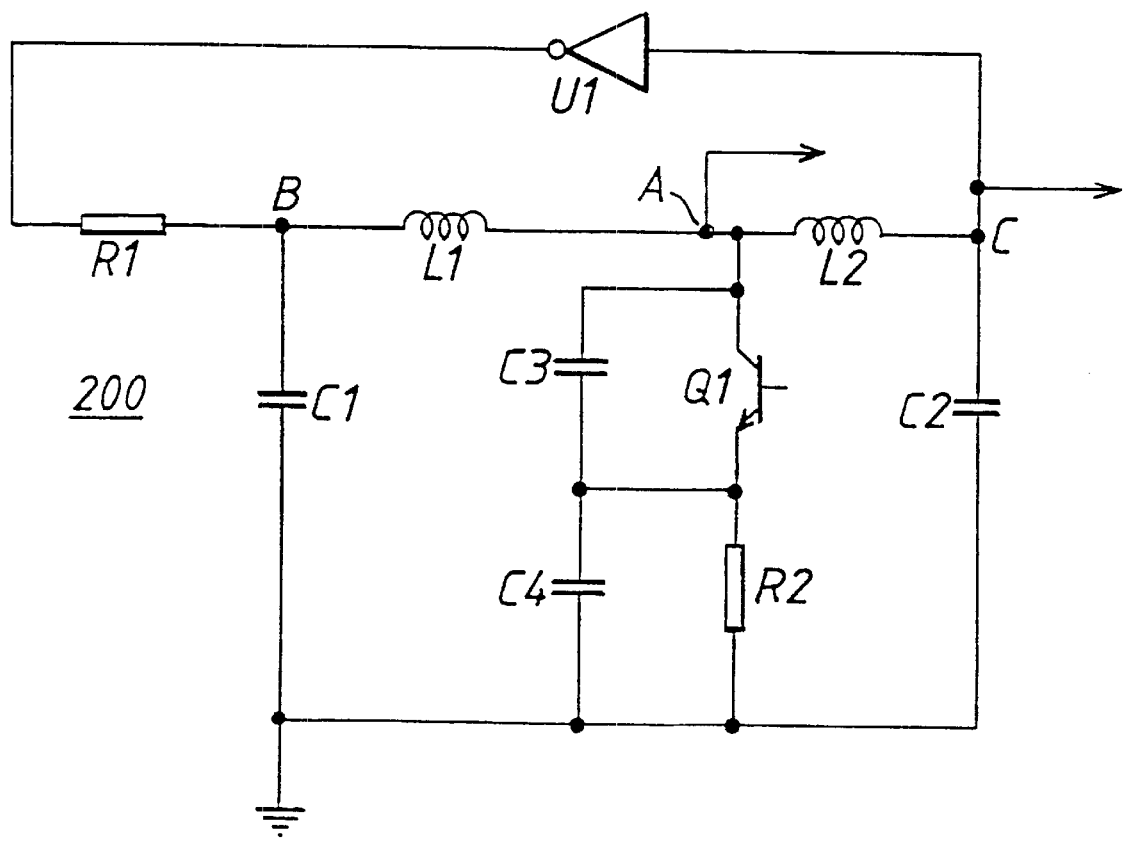
FIG. 2 is a diagram of an oscillator in accordance with the invention.

Referring to FIG. 2, the sensor 14 is connected in an oscillator circuit 200 comprising an inverter U1 having a feedback loop comprising a resistor R1 and the coils L1 and L2. The coils are connected in series, with a node A at the interconnection. The end of the coil L1 opposite the node A is connected, at node B, to a capacitor C1, the other end of which is connected to earth, and the end of coil L2 opposite the node A is connected, at node C, to a capacitor C2, the other end of which is connected to earth. This is a standard configuration for an oscillator, and the frequency of this first oscillator is determined by the resonant circuit formed by the components L1, L2, C1 and C2. The frequency may for example be less than 200 kHz, for example 40 khz.

The oscillator circuit also includes a second oscillator which comprises a transistor Q1 (the base of which is supplied with a fixed, d.c. bias level from a source which has been omitted for purposes of clarity), resistor R2, capacitors C3 and C4 and the coils L1 and L2. This is arranged to operate at a fairly high frequency, determined by the resonant circuit formed by the components L1 and L2 and the series combination of C3 and C4. At this high frequency (greater than 200 kHz, and preferably around 530 kHz) the capacitors C1 and C2 effectively act as short circuits. Accordingly, the coils L1 and L2 are each effectively coupled in parallel across the series combination of capacitors C3 and C4.

The low frequency output of the first oscillator is taken from node C, which is coupled to the input of the inverter U1. Because this is also connected via C2 to earth, and C2 is effectively a short circuit for the high frequency oscillations, node C is effectively a virtual earth for these high frequencies (i.e. no significant components of this frequency appear at this node), and therefore the low frequency signal is derived without receiving any significant influence from the high frequencies.

As a result of the inverter U1, the voltage at node B, which is coupled to the inverter output, varies in a manner which is substantially equal and opposite to the variation at node C, which is at the input of the inverter, at the low frequency. Because L1 equals L2 and C1 equals C2, these opposite and equal variations result in a signal null, for this low frequency, at the node A. Accordingly, the high frequency oscillations can be derived from this node with substantially no influence from the low frequency signals. (Similar effects can be achieved even if L1≠L2, if L1.C1=L2.C2.)

As the coin 2 moves between the coils L1 and L2, the amplitudes of the oscillations will shift to an extent dependent upon the material content of the coin. The higher frequency output will be influenced predominantly by the material at the outer surface of the coin, and the lower frequency by both the outer and the inner material. In a clad coin the inner, or bulk, material will have a significant influence.

The variations in the amplitudes at the two frequency outputs at nodes A and C are monitored, and the peak levels of the variation are used as measurements. Preferably the measurements are based on the relationship between the peak levels and the levels in the absence of a coin (for example the difference or the ratio between the peak level and the idle level). The two measurements are compared with acceptance criteria for respective denominations. Other measurements can also be made, using the same sensors and/or different sensors. For example, the frequency variations as well as, or instead of, the amplitude variations of one or both of the two oscillators within the oscillator circuit of FIG. 2 may be monitored. These, or other sensors may be used for obtaining measurements predominantly dependent on coin thickness and diameter.

Because the oscillator circuit of FIG. 2 monitors the effect of the coin at two separate frequencies, it is particularly suited for distinguishing between homogeneous coins and clad coins, and provides a particularly sensitive and compact arrangement in that the same coils are used concurrently for both frequencies.

Figure 3:
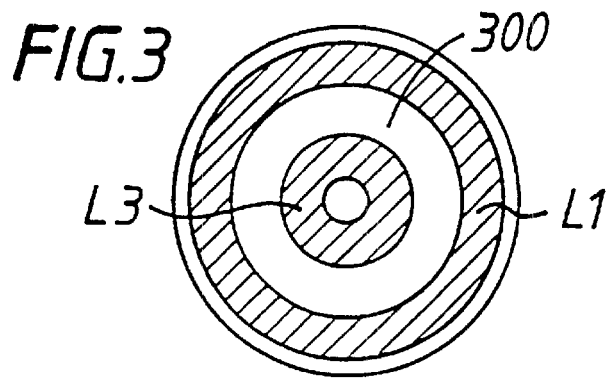
FIG. 3 schematically shows an inductance in an alternative embodiment of the invention.
Figure 4:
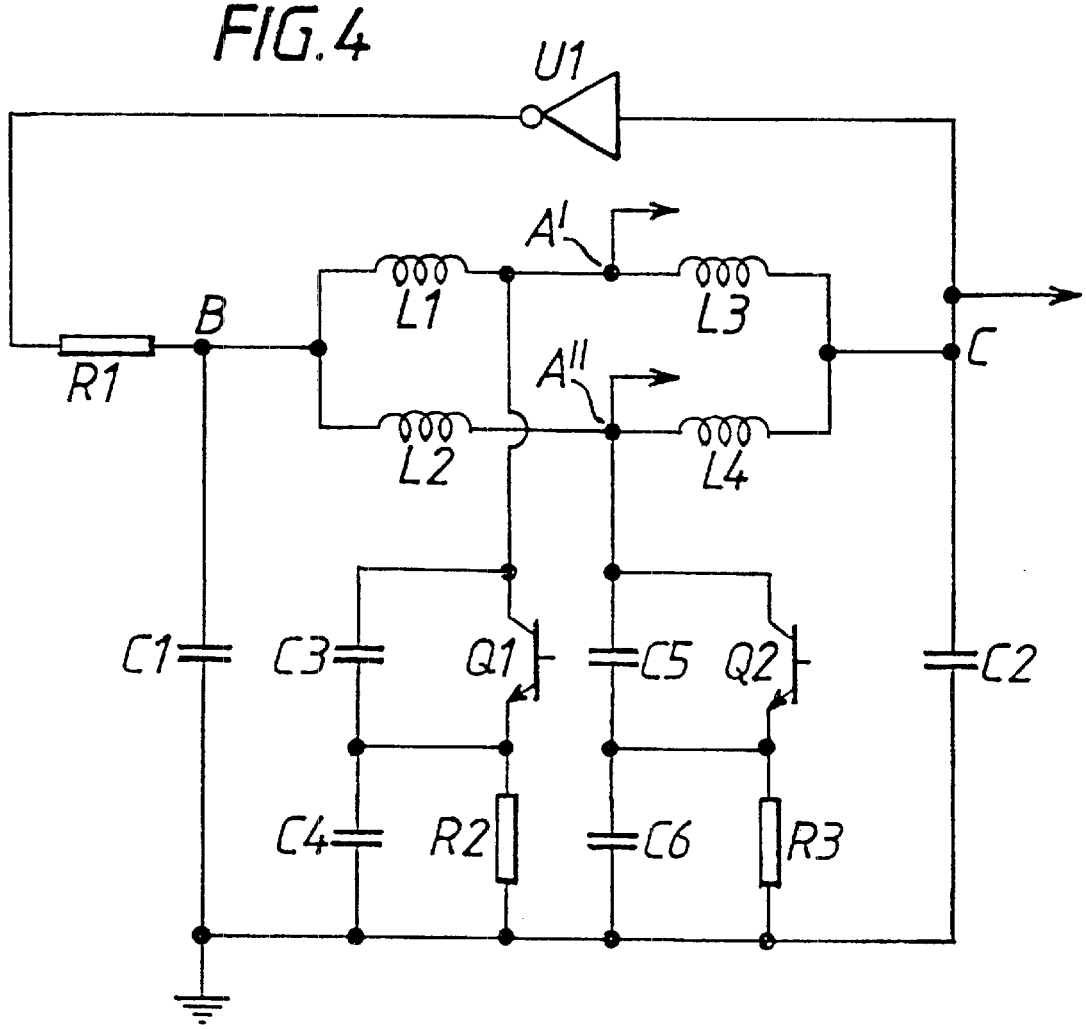
FIG. 4 is a diagram of an oscillator circuit in the alternative embodiment.

FIGS. 3 and 4 illustrate a modification of the embodiment described above, and like reference numerals represent corresponding integers. In this alternative embodiment, instead of having a single coil on each side of the coin path, there is a pair of coils on each side. For example, as indicated in FIG. 3, in addition to the coil L1 on the deck-side of the validator, there is a further coil L3. In this embodiment, the coil L3 is mounted within the coil L1. Both are mounted on the same ferrite 300, part of which extends in an annulus between the two coils so as to isolate the coils, using the techniques of EP-A-489 041. The configuration of the coils on the lid-side of the validator is similar, and comprises an outer coil L2 and an inner coil L4.

Referring to FIG. 4, the oscillator which incorporates the inverter U1 has the coils connected in its feedback loop, as in FIG. 2, but in this case the coils L1 and L3 are connected in series, as are the coils L2 and L4, with the series-connected L1 and L3 coils connected in parallel to the series-connected L2 and L4 coils.

The oscillator comprising transistor Q1 and capacitors C3 and C4 is in this case coupled to the node A' between coils L1 and L3, so that the resonant circuit is formed by the inductances L1 and L3 which are connected in parallel (because the nodes B and C are effectively virtual earths, as in FIG. 2) with each other and with the series-connected capacitors C3 and C4. A further oscillator of similar configuration is formed by transistor Q2, capacitors C5 and C6 and resistor R3, connected to the node A" between inductors L2 and L4. There is therefore a further resonant circuit formed by the parallel-connected inductors L2 and L4 connected in parallel to the series-connected capacitors C5 and C6.

The two oscillators incorporating the transistors Q1 and Q2 operate at relatively high, but different, frequencies so that the capacitors C1 and C2 are effectively short circuits. These short circuits isolate the high frequencies from the low frequency output at node C. Because L2=L4, L1=L3 and C1=C2, the low frequency of the oscillator incorporating inverter U1 is absent from the nodes A' and A".

The circuit of FIG. 4 is therefore capable of testing coins using three separate frequencies and providing three isolated outputs. In this case, in contrast to the arrangement of FIG. 2, the low frequency oscillator has the coils on opposite sides of the coin path connected in parallel.

If desired, the third oscillator involving transistor Q2 and capacitors C5 and C6 and resistor R3 can be omitted, the oscillator incorporating transistor Q1 being connected to both nodes A' and A".

The disclosures of WO-A-93/22747, EP-A-17370, U.S. Pat. No. 5,337,877 and EP-A489041 are incorporated herein by reference. In particular it will be appreciated that the techniques used for processing the outputs of the coils and checking whether these are indicative of genuine coins may be as described in those specifications or as is per se well known in the art. For example, it is well known to take measurements of coins and apply acceptability tests which are normally based on stored acceptability data. One common technique (see, e.g. GB-A-1 452 740) involves storing "windows", i.e. upper and lower limits for each test. If each of the measurements of a coin falls within a respective set of upper and lower limits, then the coin is deemed to be an acceptable coin of a particular denomination. The acceptability data could instead represent a predetermined value such as a median, the measurements then being tested to determine whether they lie within predetermined ranges of that value. Alternatively, the acceptability data could be used to modify each measurement and the test would then involve comparing the modified result with a fixed value or window. Alternatively, the acceptability data could be a look-up table which is addressed by the measurements, and the output of which indicates whether the measurements are suitable for a particular denomination (see, e.g. EP-A-0 480 736, and U.S. Pat. No. 4,951,799). Instead of having separate acceptance criteria for each test, the measurements may be combined and the result compared with stored acceptability data (cf. GB-A-2238 152 and GB-A-2 254 949). Alternatively, some of these techniques could be combined, e.g. by using the acceptability data as coefficients (derived, e.g. using a neural network technique) for combining the measurements, and possibly for performing a test on the result. A still further possibility would be for the acceptability data to be used to define the conditions under which a test is performed (e.g. as in U.S. Pat. No. 4,625,852).

References herein to coins "to be validated" by the validator are intended to relate to coins of a denomination whose population exhibits average property measurements which fall within the ranges deemed by the validator to represent a particular type of coin.

The invention has been described in the context of coin validators, but it is to be noted that the term "coin" is employed to mean any coin (whether valid or counterfeit), token, slug, washer, or other metallic object or item, and especially any metallic object or item which could be utilised by an individual in an attempt to operate a coin-operated device or system. A "valid coin" is considered to be an authentic coin, token, or the like, and especially an authentic coin of a monetary system or systems in which or with which a coin-operated device or system is intended to operate and of a denomination which such coin-operated device or system is intended selectively to receive and to treat as an item of value.

Although the invention has mainly been described in the context of coin validators, it is also applicable to currency validators generally, and could for example be used in a banknote validator, where the oscillator may be used for sensing magnetic inks and/or magnetic threads.

The oscillator of the invention could also be used in other areas.

What is claimed is:

1. An oscillator circuit comprising a plurality of resonant circuits having at least two common inductors, the resonant frequency of each resonant circuit being at least determined by the inductance of the common inductors and respective frequency-determining components of the resonant circuits, the oscillator circuit being arranged so that the common inductors are driven concurrently at a plurality of frequencies corresponding to the respective resonant frequencies of the resonant circuits.

2. An oscillator circuit as claimed in claim 1, wherein the two common inductors are connected in series in one resonant circuit and in parallel in another resonant circuit.

3. An oscillator circuit as claimed in claim 1, including a plurality of output nodes for deriving output signals at respective frequencies, at least one output node constituting a signal null for the output frequency derived at another node.

4. An oscillator circuit as claimed in claim 3, wherein each output node constitutes a signal null for output frequencies derived at other nodes.

5. An oscillator circuit as claimed in claim 3, wherein an output node for one frequency constitutes a virtual earth for another frequency.

6. An oscillator circuit as claimed in claim 3, wherein an output node for one frequency receives equal and opposite signals of another frequency.

7. An oscillator circuit as claimed in claim 1, comprising a pair of inductances coupled in series in a feedback loop to form an oscillator incorporating a first of said resonant circuits, the oscillations at one end of the series interconnection being substantially equal and opposite to those at the other end of the series interconnection, whereby the oscillations are substantially absent from the interconnection between the inductances, the circuit comprising a further oscillator incorporating a second of said resonant circuits arranged to generate oscillations at a different frequency at said interconnection.

8. An oscillator circuit as claimed in claim 7, including means for effectively producing a short circuit between the opposite ends of the series-interconnected inductances at said different frequency.

9. An oscillator circuit as claimed in claim 1, wherein the resonant circuits have a pair of common inductances, the inductances being connected in series in one resonant circuit which is arranged to oscillate at a first frequency determined by the value of the series-connected inductances, the oscillator circuit further comprising means for providing an effective short circuit across the series-connected inductances so that, in the other resonant circuit, they are connected in parallel between the effective short circuit and the series interconnected, the second resonant circuit oscillating at a second, substantially different, frequency also dependent on the inductance values.

10. An oscillator circuit as claimed in claim 9, wherein the effective short circuit is effective at the second frequency but not at the first frequency.

11. A coin validator comprising:
an oscillator circuit having a plurality of resonant circuits having at least one common inductor, wherein the resonant frequency of each resonant circuit is at least determined by the inductance of the common inductor and respective frequency-determining components of the resonant circuit, the oscillator circuit being arranged so that the inductor is driven concurrently at a plurality of frequencies corresponding to the respective resonant frequencies of the resonant circuits; and
wherein the oscillator circuit has outputs at at least two different frequencies, the outputs being influenced by the passage of a coin being tested by the coin validator.

12. A coin validator as claimed in claim 11, including means for monitoring the two outputs in order to produce measurements of the coin in dependence on the changes in the outputs caused by the proximity of the coin.

13. A coin validator as claimed in claim 11, wherein the oscillator circuit comprises a pair of coils positioned one on each side of the coin path.

14. A coin validator as claimed in claim 11, arranged to validate clad coins, wherein one of the frequencies is arranged to provide a measurement substantially dependent upon the material of the cladding of the coin, and the other frequency is arranged to provide a measurement which is significantly influenced by the inner material of the coin.

15. A coin validator as claimed in claim 11, including means for storing acceptance criteria representing a predetermined set of coins, at least one of the coins being a clad coin.

16. A coin validator comprising:
an oscillator circuit having a plurality of resonant circuits said resonant circuits having at least one common inductor influencing a respective resonant frequency of each resonant circuit, the oscillator circuit being arranged so that the inductor is driven concurrently at a plurality of frequencies corresponding to the respective resonant frequencies of the resonant circuits; and
wherein the oscillator circuit has outputs at least two different frequencies, the outputs being influenced by the passage of a coin being tested by the coin validator.

* * * * *